United States Patent
Motoshima et al.

(10) Patent No.: US 7,300,828 B2
(45) Date of Patent: Nov. 27, 2007

(54) METHOD OF MANUFACTURING A LIQUID CRYSTAL DISPLAY DEVICE

(75) Inventors: Hideto Motoshima, Izumi (JP); Hisanobu Shimodozono, Izumi (JP); Junji Nishimoto, Izumi (JP); Makoto Horinouchi, Izumi (JP); Shouichi Sonohata, Izumi (JP)

(73) Assignee: NEC LCD Technologies. Ltd., Kanagawa (JP)

( * ) Notice: Subject to any disclaimer, the term of this patent is extended or adjusted under 35 U.S.C. 154(b) by 0 days.

(21) Appl. No.: 11/411,137

(22) Filed: Apr. 26, 2006

(65) Prior Publication Data

US 2006/0240606 A1 Oct. 26, 2006

(30) Foreign Application Priority Data

Apr. 26, 2005 (JP) ............... 2005-128471

(51) Int. Cl.
*H01L 21/00* (2006.01)
(52) U.S. Cl. ............... 438/149; 438/30; 349/43
(58) Field of Classification Search ........... 438/30, 438/149; 349/43
See application file for complete search history.

(56) References Cited

U.S. PATENT DOCUMENTS

| | | | | |
|---|---|---|---|---|
| 5,371,025 A | * | 12/1994 | Sung ............ | 438/160 |
| 5,397,719 A | * | 3/1995 | Kim et al. ............ | 438/30 |
| 6,004,729 A | * | 12/1999 | Bae et al. ............ | 430/317 |
| 6,054,336 A | * | 4/2000 | Peek et al. ............ | 438/60 |
| 6,091,470 A | * | 7/2000 | Fujikawa et al. ........ | 349/122 |
| 6,204,082 B1 | * | 3/2001 | Hwang ............ | 438/30 |
| 2002/0009835 A1 | * | 1/2002 | Chen et al. ............ | 438/149 |

FOREIGN PATENT DOCUMENTS

| JP | 2002-318393 | 10/2002 |
|---|---|---|
| JP | 2004-070182 | 3/2004 |

* cited by examiner

*Primary Examiner*—Zandra V. Smith
*Assistant Examiner*—Neil Prasad
(74) *Attorney, Agent, or Firm*—Young & Thompson

(57) ABSTRACT

Disclosed is a photoresist film which is formed in a manner of covering at least a source electrode, a source line, a pixel electrode, a drain electrode, a drain line, a semiconductor film and a protective film, and further covering a gate insulting film in their vicinities. Moreover, wet and dry etchings are sequentially performed by using the photoresist film as a mask. Due to this etching, a residual pattern existing on the gate insulating film is etched.

21 Claims, 12 Drawing Sheets

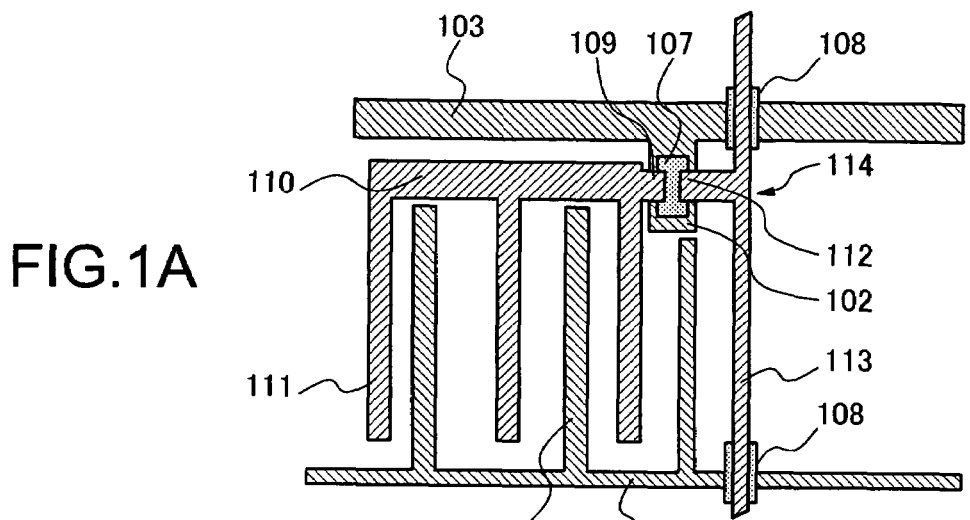
FIG.1A
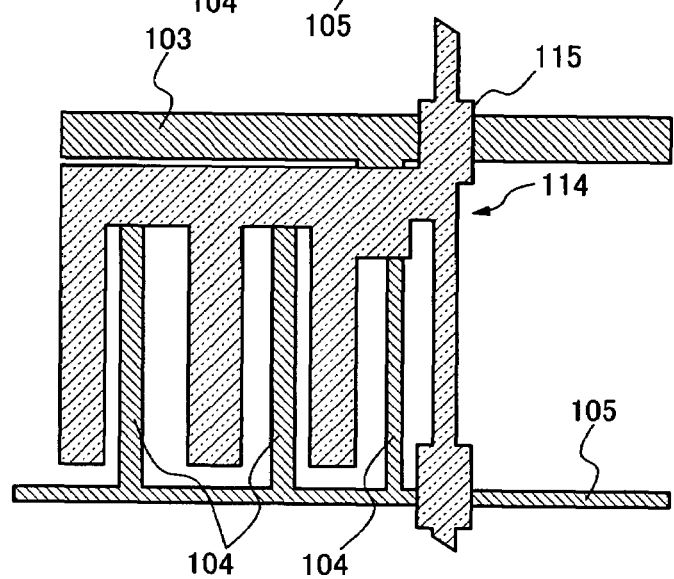
FIG.1B
FIG.1C

METHOD OF MANUFACTURING A LIQUID CRYSTAL DISPLAY DEVICE

BACKGROUND OF THE INVENTION

1. Field of the Invention

The present invention relates to a method of manufacturing a liquid crystal display device, and particularly relates to a method of manufacturing a liquid crystal display device solving a pattern defect caused by a foreign substance which attaches in the process of manufacturing.

2. Description of the Related Art

Cases where a liquid crystal display device is used as a flat panel display having advantages of its lightweight and slimness are increasingly expanding. As the cases expand, the liquid crystal display device is desired to further improve its display performance. Improvements of the display performance indicate higher brightness, definition, response speed and the like. In addition, as improvements of the display quality, display defects such as defects by bright and dark dots are strongly desired to be solved. The bright dot is a phenomenon in which a gray scale display in response to an applied voltage cannot be shown even if the applied voltage is changed, and a pixel looks white since the pixel is always on. The defect by a dark dot is a phenomenon in which a gray scale display in response to the applied voltage cannot be shown even if the applied voltage is changed, and a pixel looks black since the pixel is always off. One of causes triggering such display defects is an admixture of foreign substances in the manufacturing process.

When patterning by using a photolithography technique, coating of photoresist material, exposure and development are performed. If a foreign substance is attached before this coating or exposure, unevenness of coating, uneven amount of exposure, or the like is caused on a spot where the foreign substance has attached. Thus, a photoresist remains in an area where the photoresist should not remain on a design basis. Furthermore, a spot upon development is also considered. When such a remaining photoresist and a spot upon development occur, a pattern defect is caused if etching is performed by using such a photoresist pattern as a mask and the photoresist pattern is thereafter removed. Due to this pattern defect, conductive patterns, which should be separated, are connected, thus causing a short circuit. Moreover, if a residual pattern appears in an area where it should not exist on a design basis, the pattern comes into contact with electrodes or lines in its vicinity, which may trigger a short between electrodes or between lines.

As a method of repairing a liquid crystal display device in which such a display defect occurs, a laser irradiation method has been proposed. For example, a laser is irradiated to the electrode line of a pixel having a bright dot so that the pixel is repaired to always display in black. Please refer to Japanese Laid-open Patent No. 2002-318393 and Japanese Laid-open Patent No. 2004-070182. As a display defect, a pixel of a black display, which is always off, is less noticeable compared with a pixel which is always on. Therefore, a display defect can be eased by being repaired in a manner of making it a black display.

However, in the repairing method of a laser irradiation for a display defect, it is required to repair bright and dark dots by performing an inspection which a drive voltage is supplied to a liquid crystal display device in order to cause the device to perform a display operation, and by identifying a pixel having a display defect. In this case, when there is a short circuit or capacitance coupling in a semiconductor film with a low resistance even when measured by electric characteristics, it may not be possible to detect a defect since inspection capacity is low. In addition, if only the repairing method of a laser irradiation for a display defect is dependable, an active matrix substrate containing a pattern defect, which is a display defect, is considered to be a conforming item. Thus, the manufacturing is progressed to a step of bonding the substrate and a counter substrate together to form a liquid crystal display panel. Accordingly, a defective component is flowed out to downstream processes, thus causing an increase in fraction defective.

It is desired to solve a pattern defect area in a step where the pattern defect occurs. As a method of solving the pattern defect in the step where the pattern defect occurs, it is considered to firstly etch and then remove a conductive pattern formed by patterning a conductive film, when the pattern defect is found. After removing the conductive pattern once, a conductive film is formed anew, and a plurality of conductive patterns are then formed by patterning. However, the number of manufacturing steps increases dramatically in such a repairing method.

SUMMARY OF THE INVENTION

Therefore, an exemplary feature of the invention is to provide a method of manufacturing a liquid crystal display device which can repair a pattern defect caused by an attached foreign substance, without significantly increasing the number of manufacturing steps.

The method of manufacturing a liquid crystal display device, according to the present invention, includes, in a method of manufacturing a liquid crystal display device holding a liquid crystal layer between an active matrix substrate and a counter substrate, the steps of: forming an insulating film above the active matrix substrate; forming a plurality of conductive patterns by patterning a conductive film formed on the insulating film; forming a photoresist film which has an outline shape that corresponds the outline shape of the plural conductive patterns and covers at least the plurality of conductive patterns, and which covers at least the plurality of conductive patterns and covers the insulating film in their vicinities; and etching a residual pattern which is not covered by the photoresist film and exists above the active matrix substrate by using the photoresist film as a mask.

It is preferable that the insulating film should be a gate insulating film, and that the conductive pattern should be source and drain electrodes and a drain line, which are formed on the gate insulating film.

It is preferable that the etching in which the photoresist film is used as a mask should be an etching in which wet and dry etchings are sequentially performed.

It is preferable that a recessed portion adjacent the outline of the photoresist film should be formed by the etching in which the photoresist film is used as a mask on the upper surface of the insulating film which is not covered with the photoresist film.

It is further preferable that a semiconductor film in which a channel region for a thin film transistor should be formed between the gate insulating film, the source and drain electrodes, and that a first etching, in which the residual pattern of the conductive pattern is removed, and a second etching, in which remove the residual pattern of the semiconductor film is removed, should sequentially be performed.

It is preferable that, after removing the photoresist film, the method should further include the steps of: forming an interlayer insulating film which covers the insulating film and the conductive pattern; forming, on the interlayer insulating film, a contact hole which extends to the conductive pattern; and forming a pixel electrode on the interlayer insulating film in order to electrically connect the pixel electrode to the conductive pattern via the contact hole.

According to the present invention, a photoresist film which covers at least a plurality of conductive patterns and which further covers an insulating film in their vicinities is formed, and the residual patterns of the conductive patterns are etched by using this photoresist film as a mask. Assuming that there exists a residual pattern extending across the plurality of conductive patterns, most of the residual pattern which exist are removed.

Therefore, the method of manufacturing a liquid crystal display device, according to the present invention, the following exemplary advantage is obtained.

The advantage of the present invention is that the present invention can solve a pattern or display defect caused by an attached foreign substance in a step where the defect has occurred, following the patterning of a conductive pattern. This is because a residual pattern is removed and conductive patterns which should originally be apart are separated, thus making it possible for the present invention to make a change without causing a pattern or display defect. Moreover, it is possible to remove residual patterns existing in several areas all together due to an etching with use of one mask. Accordingly, it is possible for the present invention to solve a pattern or display defect caused by an attached foreign substance while suppressing an increase in the number of manufacturing steps as few as possible.

BRIEF DESCRIPTION OF THE DRAWINGS

There and other objects and advantages and further description of the invention will be more apparent to those skilled in the art by reference to the description, taken in connection with the accompanying drawings, in which:

FIGS. 1A to 1C are plan views for explaining a method of manufacturing a liquid crystal display device of a first exemplary embodiment of the present invention, in the order of manufacturing steps.

DETAILED DESCRIPTION OF THE PREFERRED EMBODIMENTS

Before explaining exemplary embodiments of the present invention, a basic concept of the present invention will be explained. In a method of manufacturing a liquid crystal display device, according to the present invention, an insulating film is formed above an active matrix substrate in a method of manufacturing a liquid crystal display device which holds a liquid crystal layer between the active matrix substrate and a counter substrate. In addition, a conductive film is formed on the insulating film. Moreover, a plurality of conductive patterns are formed by patterning the conductive film. Furthermore, a photoresist film is formed, the film covering at least the plurality of conductive patterns and their vicinities. Additionally, the residual pattern of the conductive pattern, which exists above the active matrix substrate, is etched by using the photoresist film as a mask. The present invention includes the above-mentioned steps.

Here, as an example of the insulating film formed above the active matrix substrate, a gate insulating film can be considered. Moreover, as an example of the plurality, of conductive patterns formed by patterning the conductive film, source and drain electrodes and a drain line can be considered.

To begin with, descriptions will be given of a method of manufacturing a liquid crystal display device of a first exemplary embodiment of the present invention, with reference to the drawings. The first exemplary embodiment is an example of applying the present invention to an In-Plane Switching (IPS) type liquid crystal display device.

Figure 3A:
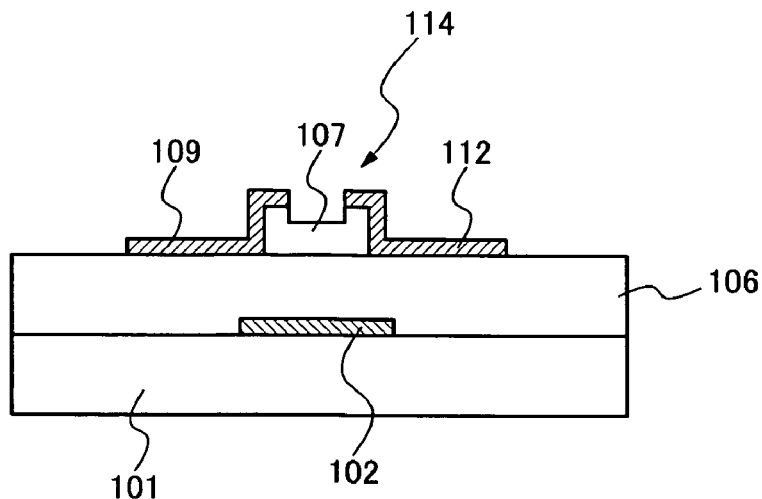
FIGS. 3A to 3C are cross-sectional views of the vicinity of a TFT 114, in the order of manufacturing steps.
Figure 3B:
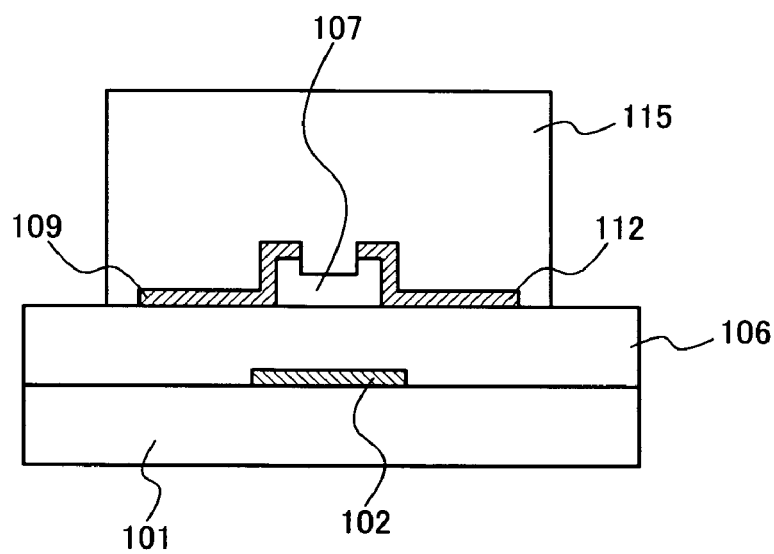
Figure 3C:
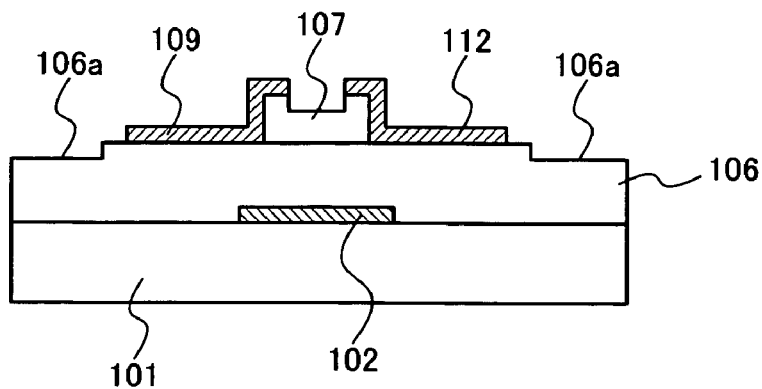

As shown in FIGS. 1A and 3A, a conductive film is firstly formed all over a glass substrate 101, and a gate electrode 102, a gate line 103, common electrodes 104 and a common line 105 are formed by patterning the film as shown in FIGS. 1A and 3C. As shown in FIG. 1A, the gate electrode 102 and the gate line 103 are formed in one piece, and the gate electrode 102 is formed by branching off the gate line 103. Further, the common electrodes 104 and the common line 105 are formed in one piece, and the common electrodes 104 are formed by branching off the common line 105. A gate insulating film 106 is then formed, covering these electrodes and lines and the glass substrate 101.

In addition, a non-doped a-Si (amorphous silicon) semiconductor film and an $n^+$ semiconductor film doped with n-type impurities are sequentially formed in order to form a multilayer structure. Thereafter, the films are patterned to form an island-shaped semiconductor film 107 and protective films 108. The semiconductor film 107 is arranged on the gate insulating film 106 above the gate electrode 102. As shown in FIG. 3A, the protective film 108 is arranged on the gate insulating film 106 in an area where the gate line 103 crosses a drain line 113. The protective film 108 is arranged in an area where the drain line 113 to be formed later crosses the gate line 103 to improve electrostatic resistance between the gate line 103 and the drain line 113. Additionally, the protective film 108 is provided to prevent the drain lines 113 from being cut due to level differences caused by the gate line 103.

Then, a conductive film is formed in a manner of covering the gate insulating film 106, the semiconductor film 107 and the protective film 108. After patterning the film, as shown in FIG. 1A, a source electrode 109, a source line 110, pixel electrodes 111, a drain electrode 112 and the drain line 113 are formed. At this point, the n+ semiconductor film in the semiconductor film 107 exposed between the source electrode 109 and the drain electrode 112 is removed, thereby separating source and drain regions with a channel region interposed therebetween. Furthermore, when removing the n+ semiconductor film, a part of the upper surface of the non-doped a-Si semiconductor film is also removed.

A thin film transistor (TFT) 114 includes the gate electrode 102, the gate insulating film 106, the semiconductor film 107, the source electrode 109 and the drain electrode 112. As shown in FIG. 1A, the source electrode 109, the source line 110 and the pixel electrodes 111 are formed in one piece, and the plurality of pixel electrodes 111 are formed by branching off the source line 110. Additionally, the drain electrode 112 and the drain line 113 are formed in one piece, and the drain electrode 112 is formed by branching off the drain line 113. The pixel electrode 111 and the common electrode 104 are arranged alternately and parallel to each other with the gate insulating film 106 interposed therebetween. Liquid crystal molecules in a liquid crystal layer are rotated in a plane surface to control a display by applying voltage between the pixel electrode 111 and the common electrode 104.

Next, as shown in FIGS. 1B and 3B, a photoresist film 115 for repair is formed. This photoresist film 115 is formed in a manner of covering at least the source electrode 109, the source line 110, the pixel electrodes 111, the drain electrode 112, the drain line 113, the semiconductor film 107 and the protective film 108, and further covering the gate insulating film 106 in their vicinities. The photoresist film 115 has an outline shape that corresponds the outline shape of the plural conductive patterns and covers the source electrode 109, the source line 110, the pixel electrodes 111, the drain electrode 112, the drain line 113, the semiconductor film 107 and the protective film 108. The photoresist film 115 also overlays residual patterns 117 extending across the conductive patterns.

Subsequently, wet and dry etchings are sequentially performed by using the photoresist film 115 as a mask. By this etching, a residual pattern not covered by the photoresist film 115 and existing on the gate insulating film 106 is etched. Furthermore, by this etching, the gate insulating film 106 is etched in areas where the photoresist film 115 does not cover, as shown in FIG. 3C. Thus, recessed portions 106a are formed on the upper surface of the gate insulating film 106.

Figure 2A:
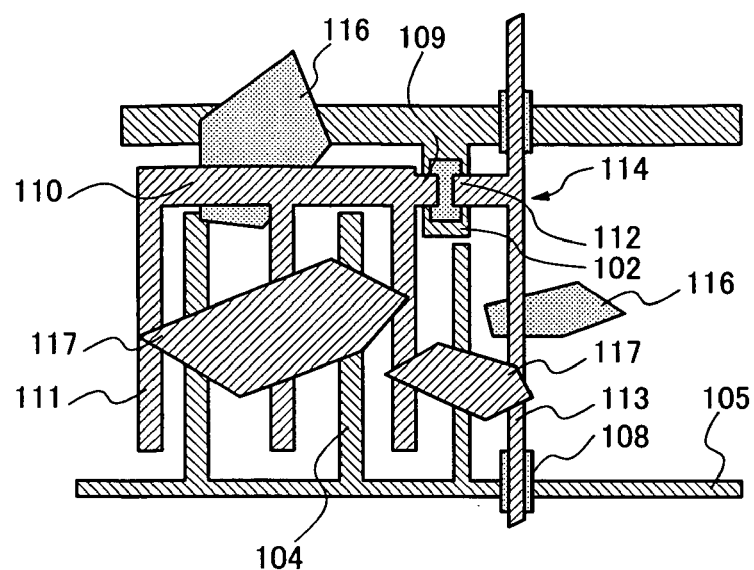
FIGS. 2A to 2C are plan views for explaining the advantages of the first exemplary embodiment of the present invention, in the order of manufacturing steps.

Next, descriptions will be given of the manufacturing method of the first exemplary embodiment, assuming a state where a pattern defect such as a residual pattern has occurred. Firstly, a conductive film is formed all over the glass substrate 101. By patterning the film, the gate electrode 102, the gate line 103, the common electrodes 104 and the common line 105 are formed as shown in FIGS. 2A and 3A. As shown in FIG. 2A, the gate electrode 102 and the gate line 103 are formed in one piece, and the gate electrode 102 is formed by branching off the gate line 103. In addition, the common electrodes 104 and the common line 105 are formed in one piece, and the common electrodes 104 are formed by branching off the common line 105. Then, the gate insulating film 106 is formed in a manner of covering these electrodes and lines and the glass substrate 101. As the gate insulating film 106, used is, for example, a SiNx film with a thickness of 300 nm to 600 nm, the SiNx film being formed by the CVD method. Moreover, a multilayer structure is formed by sequentially forming a non-doped a-Si semiconductor film and an n+ semiconductor film doped with n-type impurities. After that, the films are patterned by use of the photolithography technique, and the island-shaped semiconductor film 107 and protective film 108 are formed. If an unillustrated foreign substance attaches before coating of the photoresist material or exposure to the photoresist material, the photoresist material remains in unexpected area. If patterning for the semiconductor film is performed with a photoresist pattern in which the photoresist material is remaining in the unexpected area, a residual pattern 116 made of the semiconductor film is formed.

Subsequently, a Cr film with a thickness of 100 nm to 250 nm is formed by the sputtering method in a manner of covering the gate insulating film 106, the semiconductor film 107 and the protective film 108. The film is patterned by performing a dry etching or both of wet and dry etchings, thus forming the source electrode 109, the source line 110, the pixel electrodes 111, the drain electrode 112 and the drain line 113 as shown in FIG. 2A. In the wet etching, nitric mixed acid is used as an etchant, for example. In the dry etching, a mixed gas of chlorine and oxygen is used as an etching gas, for example. At this point, the n+ semiconductor film of the semiconductor film 107 exposed between the source electrode 109 and the drain electrode 112 is removed, thus separating the source and drain regions with the channel region interposed therebetween. Additionally, upon removing the n+ semiconductor film, a part of the surface of the non-doped a-Si semiconductor film is also removed.

If an unillustrated foreign substance attaches before coating of the photoresist material or exposure to the photoresist material, the photoresist material remains in unexpected area. If patterning for the Cr film is performed with a photoresist pattern in which the photoresist is remaining in the unexpected area, a residual pattern 117 made of the Cr film is formed. In FIG. 2A, the outlines of the normal pixel electrodes 111 and the drain line 113, and the outlines of the residual patterns 117 are drawn as separate patterns in order to facilitate understanding. In reality, since patterning is performed on one Cr film, and the pixel electrodes 111, the drain line 113 and the residual patterns 117 are formed, they are formed in one piece in the same layer.

Here, detailed descriptions will be given of a pattern defect caused by an attached foreign substance. A foreign substance results from an operator, a manufacturing facility, a photoresist film or the like. Its size is assumed to be 3 μm or over. If such a foreign substance attaches before the coating of the photoresist material or exposure to the photoresist material for patterning, photoresist material remains in unexpected area. Thus, patterning is performed with a photoresist pattern in which the photoresist is remaining. Consequently, the residual patterns 116 of the semiconductor film and the residual patterns 117 of the Cr film are formed. In the drawings, these residual patterns 116 and 117 are depicted slightly exaggeratedly to facilitate understanding. In FIG. 2A, a certain residual pattern 116 is formed below the source line 110, and the other residual patterns 116 are formed below the drain line 113. Furthermore, a certain residual pattern 117 exists in a manner of extending across three pixel electrodes 111, and they are shorted by the residual pattern 117. In addition, another residual pattern 117 exists in a manner of extending across one pixel electrode 111 and the drain line 113, and they are shorted by the residual pattern 117.

Figure 2B:
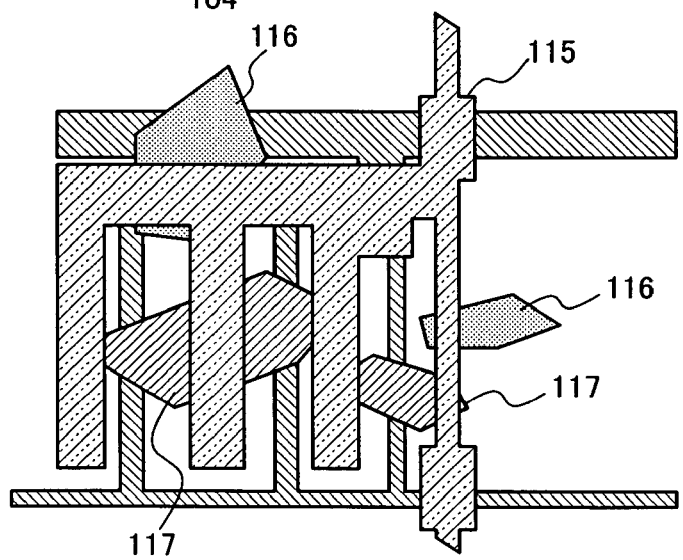

Then, the photoresist film 115 for repair is formed as shown in FIGS. 2B and 3B. This photoresist film 115 is formed in a manner of covering at least the source electrode 109, the source line 110, the pixel electrodes 111, the drain electrode 112, the drain line 113, the semiconductor film 107 and the protective film 108, and further covering the gate insulating film 106 in their vicinities. Specifically, the photoresist film 115 is formed in a manner of extending out only 0.25 μm to 1.0 μm from the outer edges of these electrodes and lines and the semiconductor film and covering the gate insulating film 106 in their vicinities. For example, the photoresist film covering each electrode or line is formed on a photomask for exposing the photoresist film, in a manner of making its width only 0.5 μm to 1.0 μm wider than that of each electrode or line.

Next, wet and dry etchings are sequentially performed by using the photoresist film 115 as a mask. This is the etching for removing the residual pattern 117 of the Cr film. In the wet etching, nitric mixed acid is used as an etchant, for example. In the dry etching, a mixed gas of chlorine and oxygen is used as an etching gas, for example. In this manner, the reason why the etchings are used in sequence is as follows: by use of the wet etching alone, the photoresist film 115 is swelled, thus inviting exfoliation or a pattern loss, which causes a defect in the etching in later steps. In addition, by use of the dry etching alone, a reduction in size is caused in the photoresist film 115, and it is possible that normal patterns such as the source electrode 109, the source line 110, the pixel electrodes 111, the drain electrode 112 and the drain line 113 are also etched. Furthermore, the dry etching is decided not to be performed three times or over.

Figure 2C:
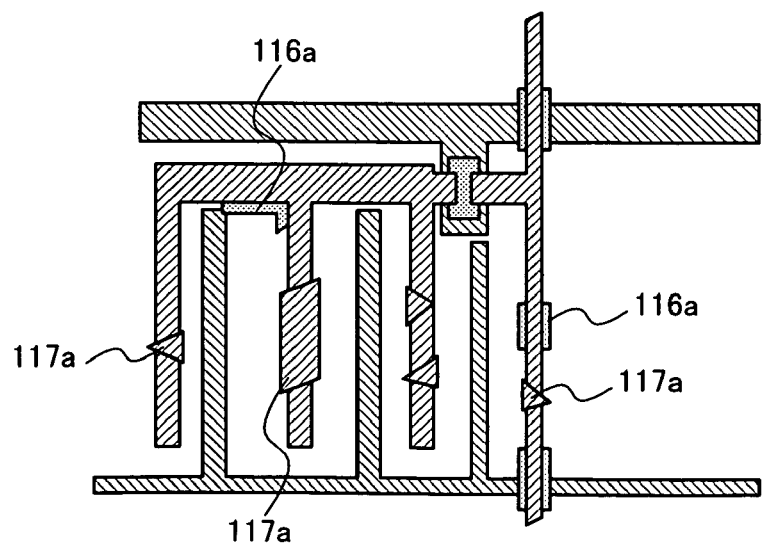

Due to these etchings, the residual pattern 117 is removed in areas which are not covered with the photoresist film 115, as shown in FIG. 2C. For this reason, most of the residual pattern 117, which existed in a manner of extending across the plurality of pixel electrodes 111, are removed, thus making it minute residual patterns 117a. The pixel electrodes 111 are separated in area where a separation is necessary. Moreover, most of the residual patterns 117, which existed in a manner of extending across the pixel electrodes 111 and the drain line 113, are removed, thus making it minute residual patterns 117a. The pixel electrodes 111 and the drain line 113 are separated.

Subsequently, the dry etching is performed by using this photoresist film 115 as a mask. This is the etching for removing the residual patterns 116 of the semiconductor film. For example, the mixed gas of $SF_6$ and He is used as an etching gas. Due to this etching, most of the residual patterns 116, which existed in a manner of extending below the source line 110 and below the drain line 113, are removed, thus making the residual patterns 116 minute residual patterns 116a. FIG. 2C shows a state after the photoresist film 115 is removed.

Moreover, due to the etching with use of the photoresist film 115 as a mask, as shown in FIG. 3C, the gate insulating film 106 in areas where the photoresist film 115 does not cover is etched by approximately 25 nm, thus forming recessed portions 106a on the surface of the gate insulating film 106. The thickness of the gate insulating film 106 is formed slightly thickly, expecting the amount of decrease due to this etching. Due to the design and manufacture considering in this manner, it is possible to prevent the occurrence of a coloring phenomenon attributable to a decrease in film thickness, in which it is colored in red upon a panel display since the spectrum of transmittance of a backlight is shifted.

Figure 4A:
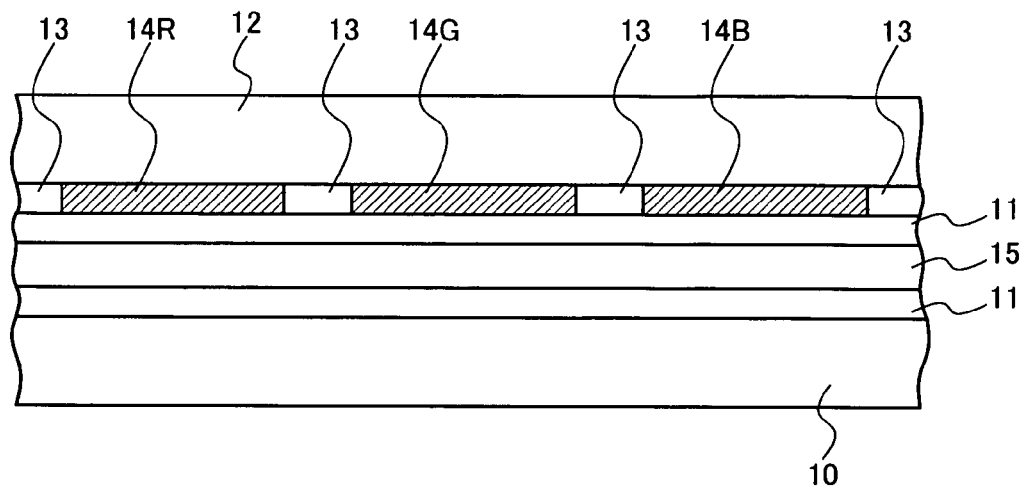
FIG. 4A is a cross-sectional view of a liquid crystal display device of an IPS type.

Thereafter, similarly to a method of manufacturing a conventional IPS-type liquid crystal display device, an IPS-type liquid crystal display device is completed as shown in FIG. 4A. To give an explanation briefly, an orientation film 11 is formed on the surface of an active matrix substrate 10 described above. A shielding film 13, which is a matrix or striped shape, is formed in areas between pixels within a display area on the surface of a counter substrate 12. A color filter is arranged in each area of pixel regions surrounded by the shielding films 13. The color filter is constituted of a red layer 14R, a green layer 14G and a blue layer 14B. Further, the orientation film 11 is formed on the surfaces of the color filters and the shielding film 13. Additionally, the active matrix substrate 10 and the counter substrate 12 are bonded in a state of holding a liquid crystal layer 15, thereby completing the liquid crystal display device of the embodiment.

According to the embodiment, the etching is performed by using the photoresist film 115 as a mask after patterning the source electrode 109, the source line 110, the pixel electrodes 111, the drain electrode 112 and the drain line 113. Due to this etching, most of the residual patterns 117, which are formed upon patterning the source electrode 109, the source line 110, the pixel electrodes 111, the drain electrode 112 and the drain line 113, are removed, thus leaving the residual patterns 117 as the minute residual patterns 117a. Since unnecessary residual patterns 117 are removed, a short circuit between neighboring lines and electrodes can be solved. Therefore, it is made possible to solve a pattern defect caused by a foreign substance. In addition, due to the etching with use of the photoresist film 115 as a mask, the residual patterns 116, which are formed upon patterning the semiconductor film 107 and the protective films 108, is also etched, and most of the patterns are removed. Hence, the residual patterns 116 are made to be the minute residual patterns 116a. Since the unnecessary residual patterns 116 are removed, a possibility of a short circuit between neighboring lines and electrodes is made smaller, thus making it possible to solve a pattern defect caused by a foreign substance.

Moreover, in the embodiment, since the residual patterns 117 in several areas are etched all together, it is possible to solve a pattern defect caused by a foreign substance while increasing the number of manufacturing steps as few as possible. In addition, since the residual patterns 116 in several areas are etched all together using the same mask, it is possible to solve a pattern defect caused by a foreign substance while increasing the number of manufacturing steps as few as possible. Moreover, in the embodiment, since the residual patterns 116 and 117 are etched using the same photoresist film 115 as a mask, it is possible to solve a pattern defect caused by a foreign substance while increasing the number of manufacturing steps as few as possible.

It should be noted that the liquid crystal display device of the embodiment is configured to perform a display control by rotating liquid crystal molecules in a liquid crystal layer in a plane surface since voltage is applied between the pixel electrode 111 and the common electrode 104. In the drawing of FIG. 2C, although the minute residual patterns 117a remain on the outer edges of the pixel electrodes 111, since the residual patterns 117a are minute, they are not recognized on a display, there is no problem. Furthermore, since the residual patterns 117a are minute, there is no problem in the characteristic of brightness.

Next, descriptions will be given of a method of manufacturing a liquid crystal display device of a second exemplary embodiment of the present invention, with reference to the drawings. The second exemplary embodiment is an example of applying the present invention to a method of manufacturing a Twisted Nematic (TN) type liquid crystal display device.

Figure 5A:
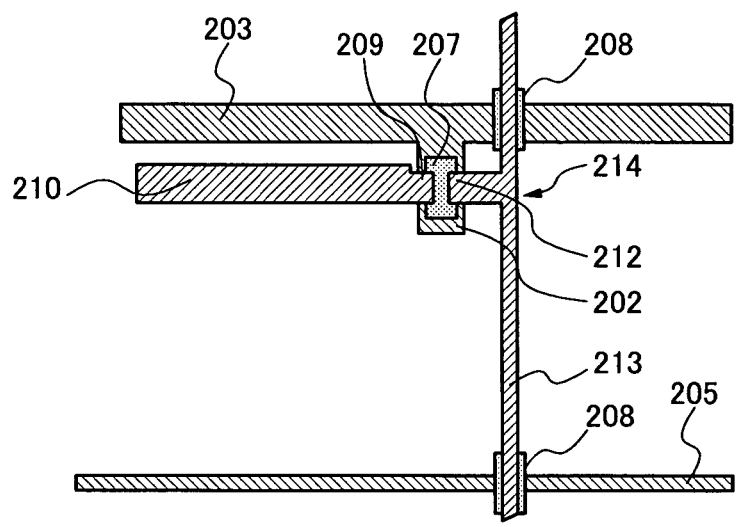
FIGS. 5A to 5C are plan views for explaining a method of manufacturing a liquid crystal display device of a second exemplary embodiment of the present invention, in the order of manufacturing steps.
Figure 6A:
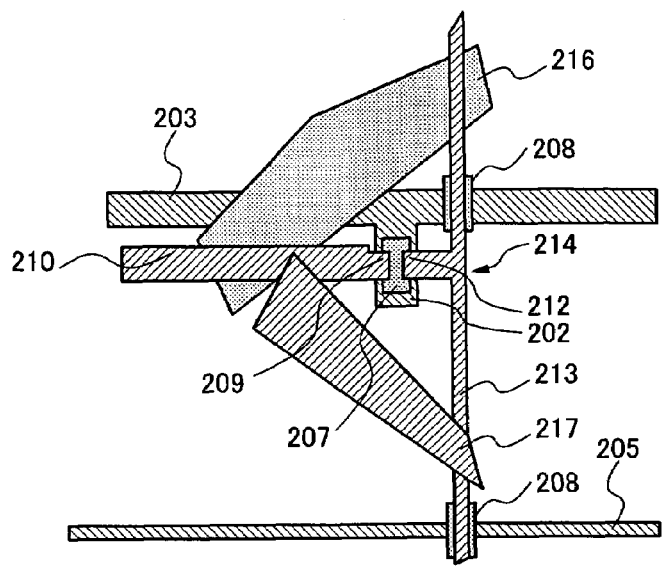
FIGS. 6A to 6D are plan views for explaining the advantages of the second exemplary embodiment of the present invention, in the order of manufacturing.

Firstly, a conductive film is formed all over a glass substrate 201. By patterning the film, a gate electrode 202, a gate line 203 and a common line 205 are formed as shown in FIGS. 5A and 6E. As shown in FIG. 5A, the gate electrode 202 and the gate line 203 are formed in one piece, and the gate electrode 202 is formed by branching off the gate line 203. A gate insulating film 206 covering these electrodes and lines and the glass substrate 201 is then formed.

Furthermore, a non-doped a-Si semiconductor film and an n⁺ semiconductor film doped with n-type impurities are sequentially deposited to form a multilayer structure. Thereafter, the films are patterned and an island-shaped semiconductor film 207 and protective films 208 are formed. The semiconductor film 207 is arranged on the gate insulating film 206 above the gate electrode 202. The protective films 208 are arranged in an area where a drain line 213, which is to be formed later, crosses the gate line 203 in order to improve electrostatic resistance of the gate line 203 and the drain line 213. In addition, the protective film 208 are provided to prevent the drain lines 213 from being cut due to level differences caused by the gate lines 203.

Next, a conductive film is formed in a manner of covering the gate insulating film 206, the semiconductor film 207 and the protective film 208. By patterning the conductive film, a source electrode 209, a source line 210, a drain electrode 212 and the drain line 213 are formed as shown in FIG. 5A. At this point, the n⁺ semiconductor film of the semiconductor film 207 exposed between the source electrode 209 and the drain electrode 212 is removed. Hence, source and drain regions are separated with a channel region interposed therebetween. Furthermore, upon removing the n⁺ semiconductor film, a part of the surface of the non-doped a-Si semiconductor film is also removed.

A thin film transistor (TFT) 214 includes the gate electrode 202, the gate insulating film 206, the semiconductor film 207, the source electrode 209 and the drain electrode 212. As shown in FIG. 5A, the source electrode 209 and the source line 210 are formed in one piece. Moreover, the drain electrode 212 and the drain line 213 are formed in one piece, and the drain electrode 212 is formed by branching off the drain line 213.

Figure 5B:
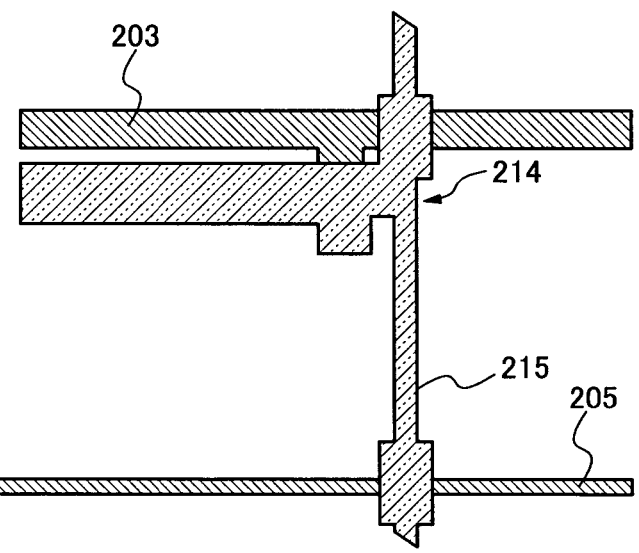
Figure 6B:
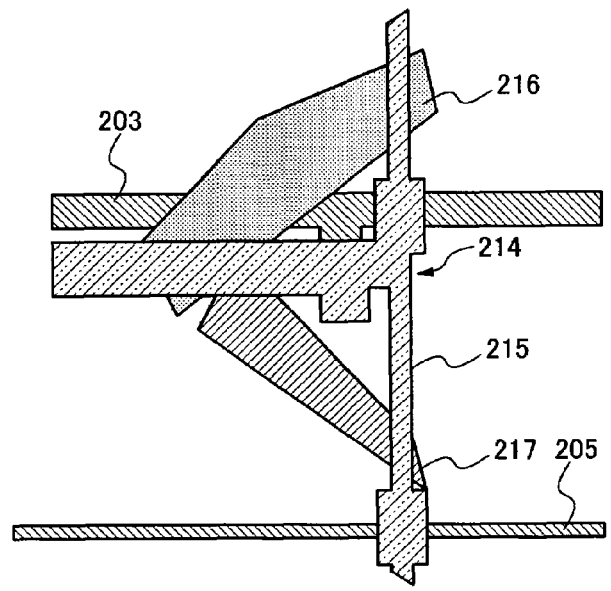
Figure 6C:
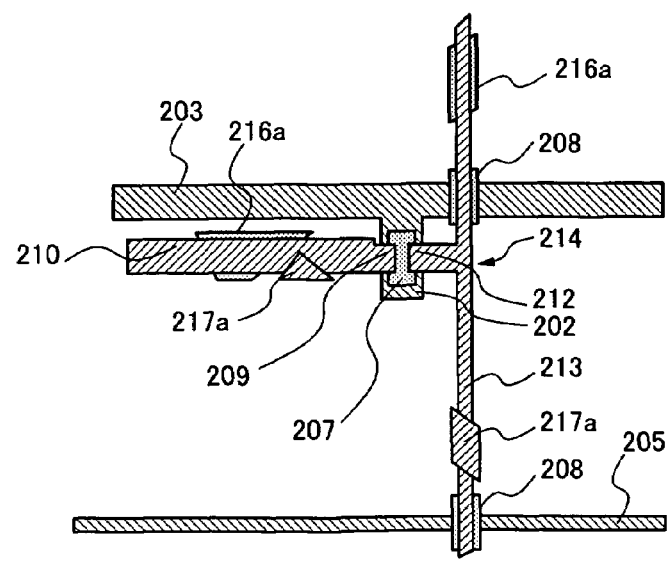
Figure 6D:
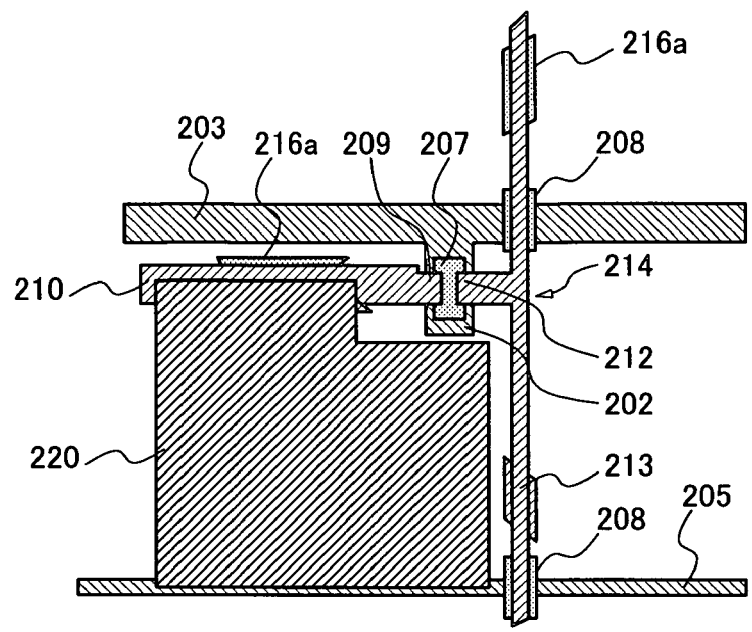
Figure 6E:
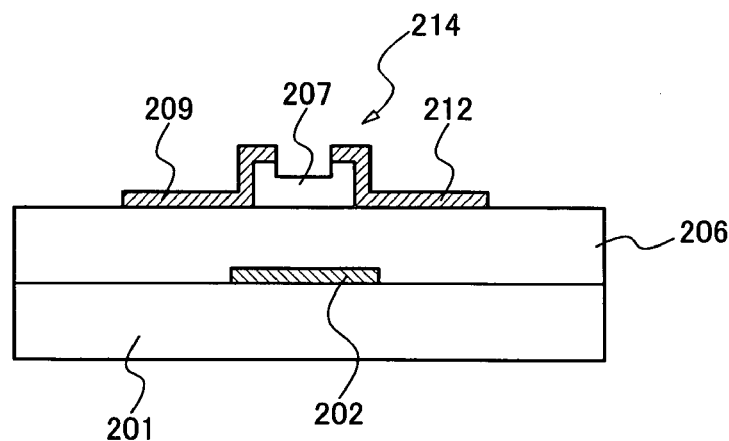
FIGS. 6E to 6I are cross-sectional views of the vicinity of a TFT 214 in the order of manufacturing steps.
Figure 6F:
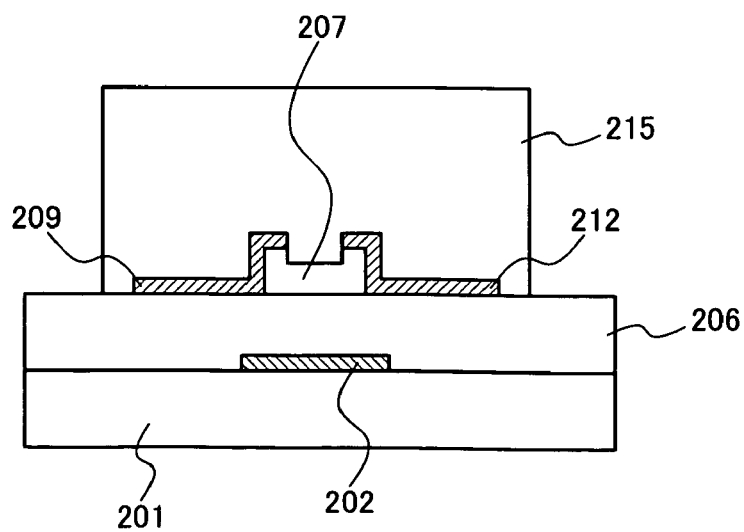

Then, a photoresist film 215 for repair is formed as shown in FIGS. 5B and 6F. This photoresist film 215 is formed in a manner of covering at least the source electrode 209, the source line 210, the drain electrode 212, the drain line 213, the semiconductor film 207 and the protective film 208, and further covering the gate insulating film 206 in their vicinities. The photoresist film 215 has an outline shape that corresponds the outline shape of the plural conductive patterns and covers the source electrode 209, the source line 210, the drain electrode 212, the drain line 213, the semiconductor film 207 and the protective film 208. The photoresist film 215 also overlays residual patterns 217 extending across the conductive patterns.

Figure 6G:
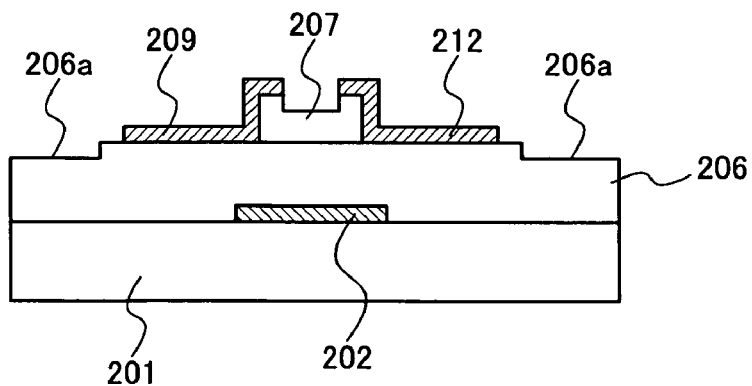

Next, wet and dry etchings are sequentially performed by using this photoresist film 215 as a mask. Due to this etching, a residual pattern not covered by the photoresist film 215 and existing on the gate insulating film 206 is etched. Moreover, due to this etching, the gate insulating film 206 in areas where the photoresist film 215 does not cover is etched as shown in FIG. 6G, thus forming recessed portions 206a on the surface of the gate insulating film 206.

Figure 5C:
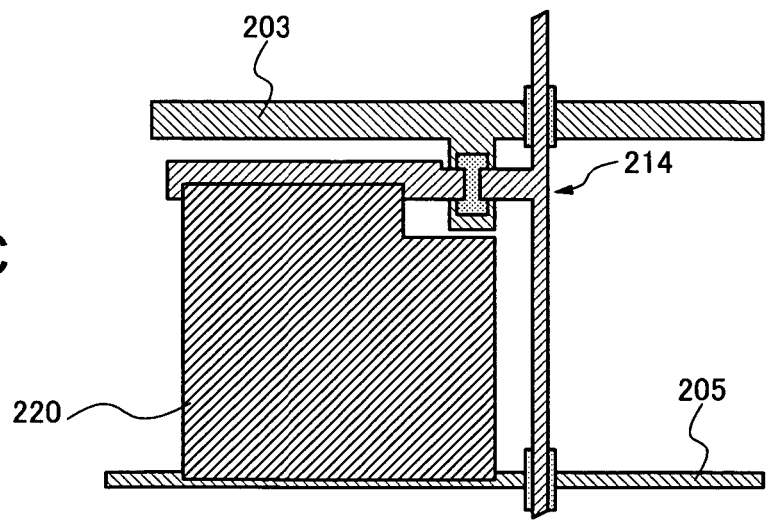
Figure 6H:
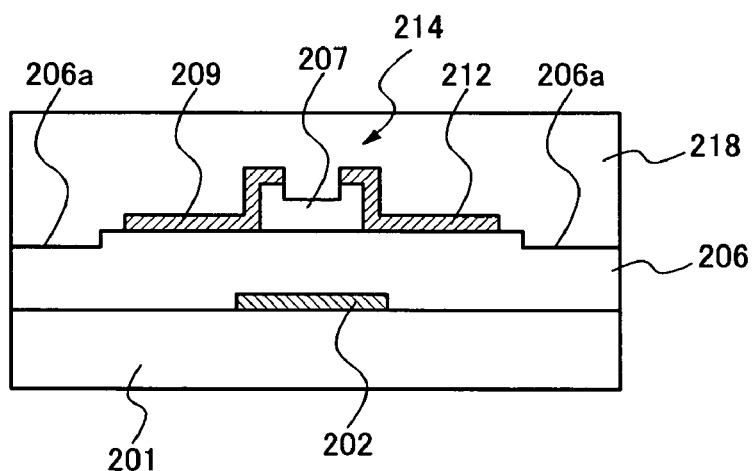
Figure 6I:
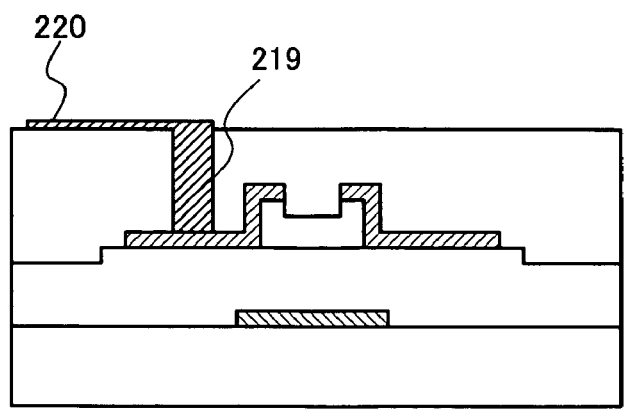

Subsequently, as shown in FIG. 6H, an interlayer insulating film 218 is formed all over. In addition, a contact hole 219 is formed in the interlayer insulating film 218 as shown in FIG. 6I. Further, as shown in FIGS. 5C and 6I, a pixel electrode 220 is formed on the interlayer insulating film 218, thus being electrically connected to the source electrode 209 via the contact hole 219.

Next, descriptions will be given of a manufacturing method of the second exemplary embodiment, assuming a state where a pattern defect such as a residual pattern has occurred. Firstly, a conductive film is formed all over the glass substrate 201. By patterning the film, the gate electrode 202, the gate line 203 and the common electrode 205 are formed as shown in FIGS. 6A and 6E. As shown in FIG. 6A, the gate electrode 202 and the gate line 203 are formed in one piece, and the gate electrode 202 is formed by branching off the gate line 203. Following this, the gate insulating film 206 is formed in a manner of covering these electrodes and lines and the glass substrate 201. For example, a SiNx film with a thickness of 300 nm to 600 nm is used as the gate insulating film 206, the film being formed by the CVD method. Moreover, a non-doped a-Si semiconductor film and an n⁺ semiconductor film doped with n-type impurities are sequentially deposited to form a multilayer structure. Thereafter, the films are patterned and the island-shaped semiconductor film 207 and protective film 208 are formed. If an unillustrated foreign substance attaches before the coating of the photoresist material or exposure to the photoresist material, the photoresist material remains in unexpected area. If patterning for the semiconductor film is performed with a photoresist pattern in which the photoresist is remaining in the unexpected area, a residual pattern 216 made of the semiconductor film is formed.

Then, a Cr film with a thickness of 100 nm to 250 nm is formed by the sputtering method in a manner of covering the gate insulating film 206, the semiconductor film 207 and the protective film 208. The film is patterned by performing wet and dry etchings in sequence. As shown in FIG. 6A, the source electrode 209, the source line 210, the drain electrode 212 and the drain line 213 are formed. At this point, the n⁺ semiconductor film of the semiconductor film 207 exposed between the source electrode 209 and the drain electrode 212 is removed. Hence, the source and drain regions are separated with a channel region interposed therebetween. Furthermore, upon removing the n⁺ semiconductor film, a part of the surface of the non-doped a-Si semiconductor film is also removed.

If an unillustrated foreign substance attaches before the coating of the photoresist material or exposure to the photoresist material, the photoresist material remains in unexpected area. If patterning for the Cr film is performed with a photoresist pattern in which the photoresist is remaining in the unexpected area, a residual pattern 217 made of the Cr film is formed. In FIG. 6A, the outlines of the normal source line 210 and drain line 213 and the outline of the residual pattern 217 are drawn as separate patterns to facilitate understanding. In reality, patterning is performed on one Cr film and the source line 210, the drain line 213 and the residual pattern 217 are formed. Therefore, they are formed in one piece in the same layer.

Here, detailed descriptions will be given of a pattern defect caused by an attached foreign substance. The foreign substance results from an operator, a manufacturing facility, a photoresist film or the like. Its size is assumed to be approximately 3 μm or over. If such a foreign substance attaches before the coating of the photoresist material or exposure to the photoresist material for patterning, photoresist material remains in unexpected area. Hence, patterning is performed with a photoresist pattern in which the photoresist is remaining. Consequently, the residual pattern 216 of the semiconductor film and the residual pattern 217 of the Cr film are formed. The residual patterns 216 and 217 are depicted slightly exaggeratedly to facilitate understanding. In FIG. 6A, one residual pattern 216 exists in a manner of extending below the source line 210 and the drain line 213. The other residual pattern 217 exists in a manner of extending across the source line 210 and the drain line 213, and they are shorted by the residual pattern 217.

The photoresist film 215 for repair is then formed as shown in FIGS. 6B and 6F. This photoresist film 215 is formed in a manner of covering at least the source electrode 209, the source line 210, the drain electrode 212, the drain line 213, the semiconductor film 207 and the protective film 208, and further covering the gate insulating film 206 in their vicinities. Specifically, the photoresist film 215 extends only 0.25 μm to 1.0 μm outside from the outer edges of these electrodes and lines and the semiconductor film. For example, the photoresist film covering each electrode and line is formed on a photomask for exposing the photoresist film, in a manner of making its width only 0.5 μm to 1.0 μm wider than that of each electrode or line.

Next, wet and dry etchings are sequentially performed by using this photoresist film 215 as a mask. This is the etching for removing the residual pattern 217 of the Cr film. In the wet etching, nitric mixed acid is used as an etchant, for example. In the dry etching, a mixed gas of chlorine and oxygen is used as an etching gas, for example. The reason of performing the etchings in sequence in this manner is as explained in the first embodiment. Due to this etching, the residual pattern 217 in areas where the photoresist film 215 does not cover is removed as shown in FIG. 6C. For this reason, most of the residual pattern 217 which has been existed in a manner of extending across the source line 210 and the drain line 213 are removed, thus leaving it as minute residual patterns 217a. The source line 210 and the drain line 213 are separated.

The dry etching is performed by using the photoresist film 215 as a mask. This is the etching for removing a residual pattern 216 of the semiconductor film. The mixed gas of $SF_6$ and He is used as an etching gas, for example. Due to this etching, most of the residual pattern 216 which has been existed in a manner of extending below the source line 210 and the drain line 213 are removed, thus leaving it as minute residual patterns 216a. FIG. 6C shows a state after removing the photoresist film 215.

Furthermore, by using this photoresist film 215 as a mask, as shown in FIG. 6G, the gate insulating film 206 in areas where the photoresist film 215 does not cover is etched by approximately 25 nm, and the recessed portions 206a are formed on the surface of the gate insulating film 206. The thickness of the gate insulating film 206 is formed slightly thickly, expecting the amount of a decrease due to this etching. Due to the design and manufacture considering in this manner, it is possible to prevent the occurrence of a coloring phenomenon attributable to a decrease in film thickness, in which it is colored in red upon a panel display since the spectrum of transmittance of a backlight is shifted.

Then, as shown in FIG. 6H, the interlayer insulating film 218 is formed all over. Furthermore, as shown in FIG. 6I, the contact hole 219 is formed in the interlayer insulating film 218. Moreover, as shown in FIGS. 6D and 6I, the pixel electrode 220 is formed on the interlayer insulating film 218, thus being electrically connected to the source electrode 209 via the contact hole 219.

Figure 4B:
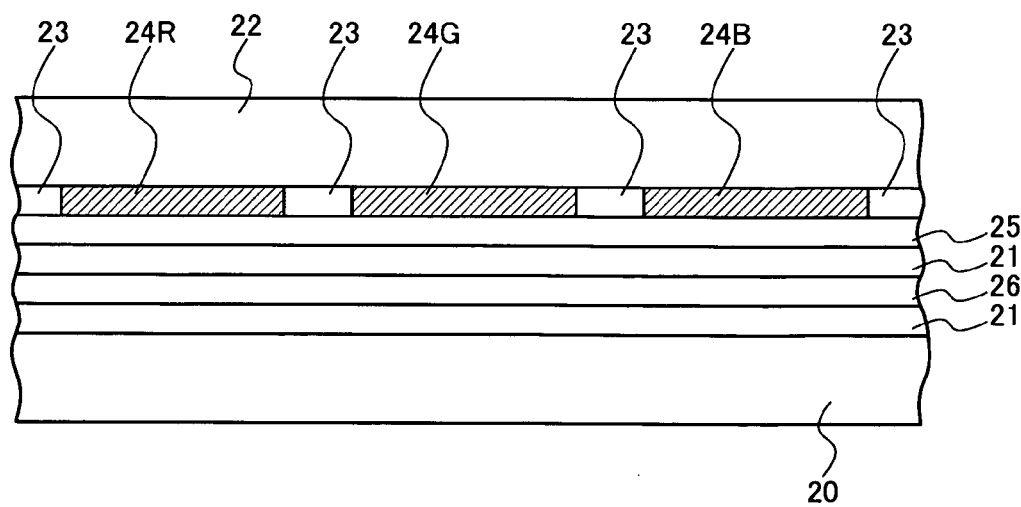
FIG. 4B is a cross-sectional view of a liquid crystal display device of a TN type.

Thereafter, similarly to a method of manufacturing a conventional TN-type liquid crystal display device, a TN-type liquid crystal display device is completed as shown in FIG. 4B. To give an explanation briefly, an orientation film 21 is formed on the surface of an active matrix film substrate 20 described above. A shielding film 23, which is a matrix or striped shape, is formed in areas between pixels within a display area on the surface of a counter substrate 22. A color filter is arranged in each area of a pixel region surrounded by the shielding films 23. The color filter is constituted of a red layer 24R, a green layer 24G and a blue layer 24B. Further, a counter electrode 25 is formed on the surfaces of the color filters and the shielding film 23. Additionally, the active matrix substrate 20 and the counter substrate 22 are bonded in a state of holding a liquid crystal layer 26, thereby completing a liquid crystal display device of the embodiment. In this TN-type liquid crystal display device, voltage is applied between the pixel electrode of the active matrix substrate 20 and the counter electrode 25 of the counter substrate 22. Therefore, the angles of liquid crystal molecules in the liquid crystal layer is controlled, and display is performed.

According to the embodiment, the etching is performed by using the photoresist film 215 as a mask after patterning the source electrode 209, the source line 210, the drain electrode 212 and the drain line 213. Due to this etching, most part of the residual pattern 217 formed upon patterning the source electrode 209, the source line 210, the drain electrode 212 and the drain line 213, are removed, and the remaining parts become the minute residual patterns 317a. Since the unnecessary residual pattern 217 is removed, a short between neighboring lines and electrodes does not occur. Therefore, it is made possible to solve a pattern defect caused by a foreign substance. In addition, due to the etching with use of the photoresist film 215 as a mask, the residual pattern 216 formed upon patterning the semiconductor film 207 and the protective films 208 is also etched, and most of the patterns are removed. Hence, they are made to be the minute residual patterns 216a. Since the unnecessary residual pattern 216 is removed, a short between neighboring lines and electrodes does not occur. Therefore, it is made possible to solve a pattern defect caused by a foreign substance.

Moreover, in the embodiment, since the residual pattern 217 in several areas is etched all together, it is possible to solve a pattern defect caused by a foreign substance while increasing the number of manufacturing steps as few as possible. Additionally, since the residual pattern 216 in a plurality of areas is etched all together by use of the same mask, it is possible to solve a pattern defect caused by a foreign substance while increasing the number of manufacturing steps as few as possible. Moreover, in the embodiment, since the residual patterns 216 and 217 are etched using the same photoresist film 215 as a mask, it is possible to solve a pattern defect caused by a foreign substance while increasing the number of manufacturing steps as few as possible.

Next, descriptions will be given of a method of manufacturing a liquid crystal display device of a third exemplary embodiment of the present invention, with reference to the drawings. The third exemplary embodiment is an example of applying the present invention to a method of manufacturing an In-Plane Switching (IPS) type liquid crystal display device.

While the IPS type liquid crystal display device of the first embodiment has a structure in which the pixel electrodes are arranged in a different layer from the common electrodes, the IPS type liquid crystal display device of the third embodiment has a structure in which pixel electrodes are arranged in the same layer as common electrodes.

Figure 7A:
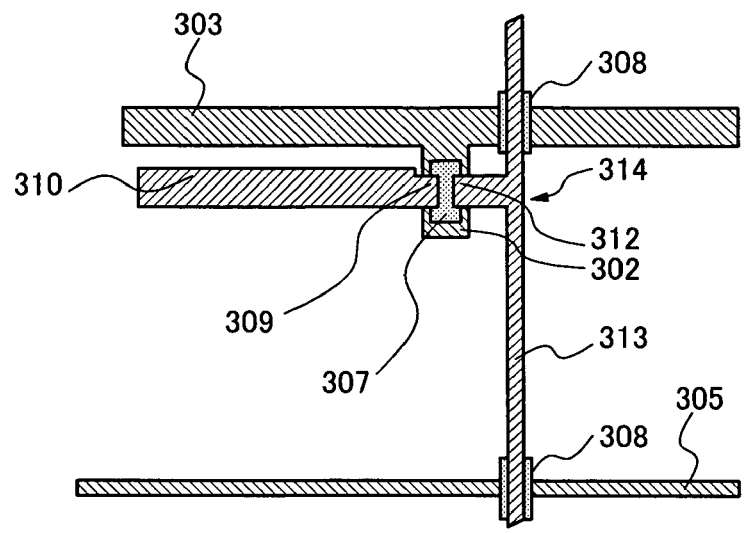
FIGS. 7A to 7C are plan views for explaining a method of manufacturing a liquid crystal display device of a third exemplary embodiment of the present invention, in the order of manufacturing steps.
Figure 8A:
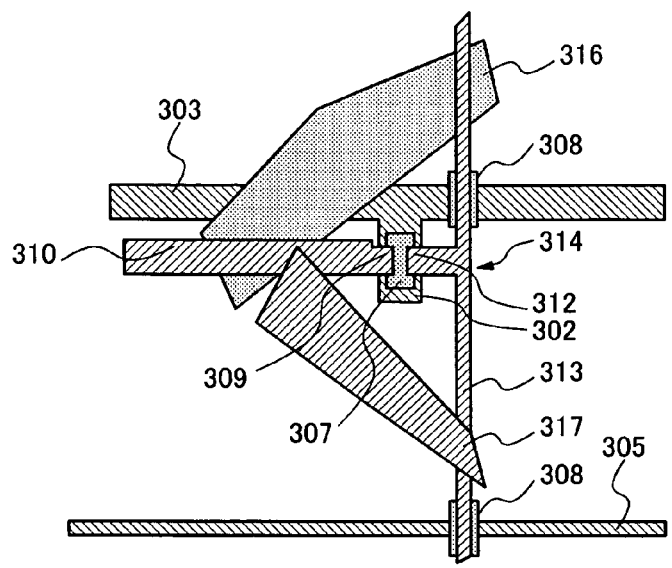
FIGS. 8A to 8D are plan views for explaining the advantages of the third exemplary embodiment of the present invention, in the order of manufacturing.

Firstly, a conductive film is formed all over a glass substrate 301. By patterning the film, a gate electrode 302, a gate line 303 and a common line 305 are formed as shown in FIGS. 7A and 8E. As shown in FIG. 7A, the gate electrode 302 and the gate line 303 are formed in one piece, and the gate electrode 302 is formed by branching off the gate line 303. Then, a gate insulating film 306 is formed in a manner of covering these electrodes and lines and the glass substrate 301.

Moreover, a non-doped a-Si semiconductor film and an n$^+$ semiconductor film doped with n-type impurities are sequentially deposited to form a multilayer structure. Thereafter, the films are patterned, and an island-shaped semiconductor film 307 and protective films 308 are formed. The semiconductor film 307 is arranged on the gate insulating film 306 above the gate electrode 302. The protective film 308 are arranged in an area in which a drain line 313, which is formed later, crosses the gate line 303 in order to improve electrostatic resistance of the gate line 303 and the drain line 313. Furthermore, the protective film 308 are provided to prevent the drain lines 313 from being cut due to level differences caused by the gate lines 303.

Next, a conductive film is formed in a manner of covering the gate insulating film 306, the semiconductor film 307 and the protective film 308. By patterning the film, as shown in FIG. 7A, a source electrode 309, a source line 310, a drain electrode 312 and the drain line 313 are formed. At this point, the n$^+$ semiconductor film of the semiconductor film 307 exposed between the source electrode 309 and the drain electrode 312 is removed. Hence, source and drain regions are separated with a channel region interposed therebetween. Additionally, upon removing the n$^+$ semiconductor film, a part of the surface of the non-doped a-Si semiconductor film is removed.

A thin film transistor (TFT) 314 is formed of the gate electrode 302, the gate insulating film 306, the semiconductor film 307, the source electrode 309 and the drain electrode 312. As shown in FIG. 7A, the source electrode 309 and the source line 310 are formed in one piece. Moreover, the drain electrode 312 and the drain line 313 are formed in one piece, and the drain electrode 312 is formed by branching off the drain line 313.

Figure 7B:
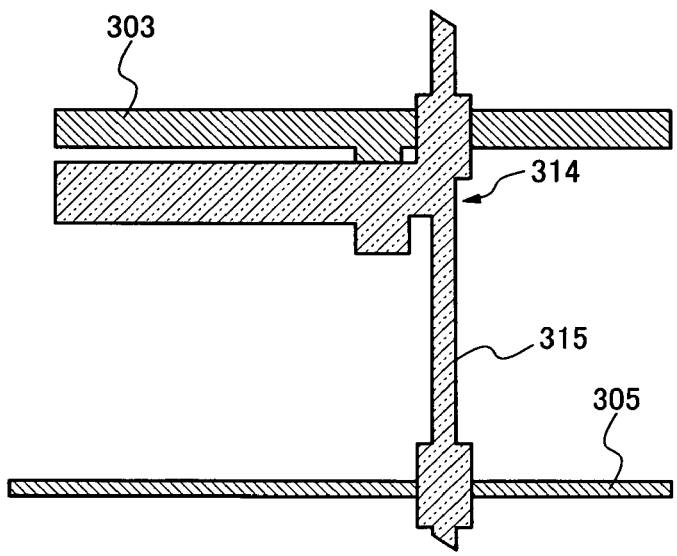
Figure 8B:
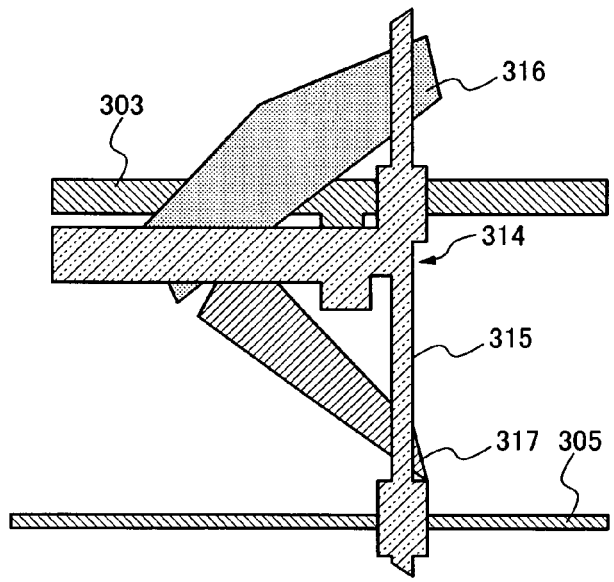
Figure 8C:
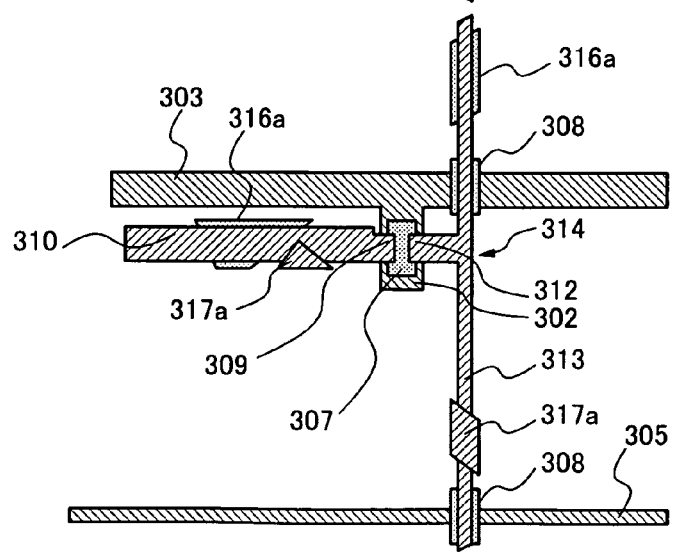
Figure 8D:
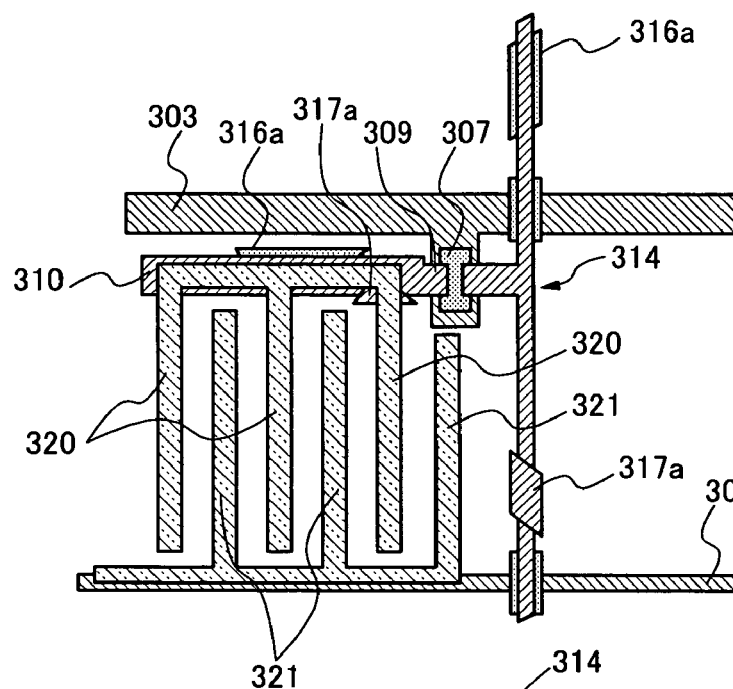
Figure 8E:
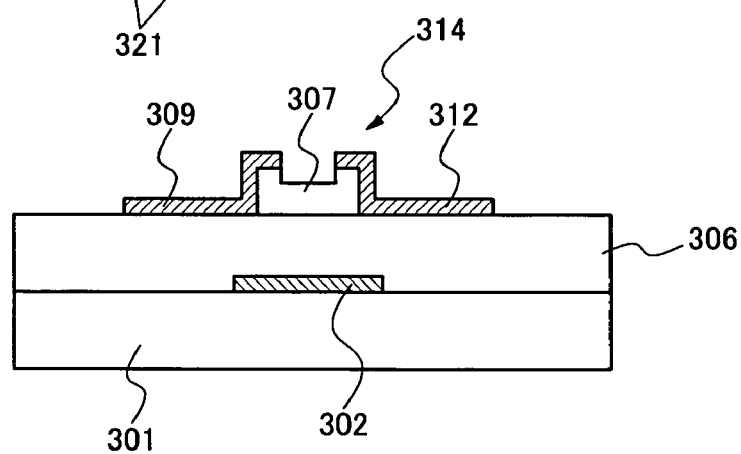
FIGS. 8E to 8I are cross-sectional views of the vicinity of a TFT 314 in the order of manufacturing steps.
Figure 8F:
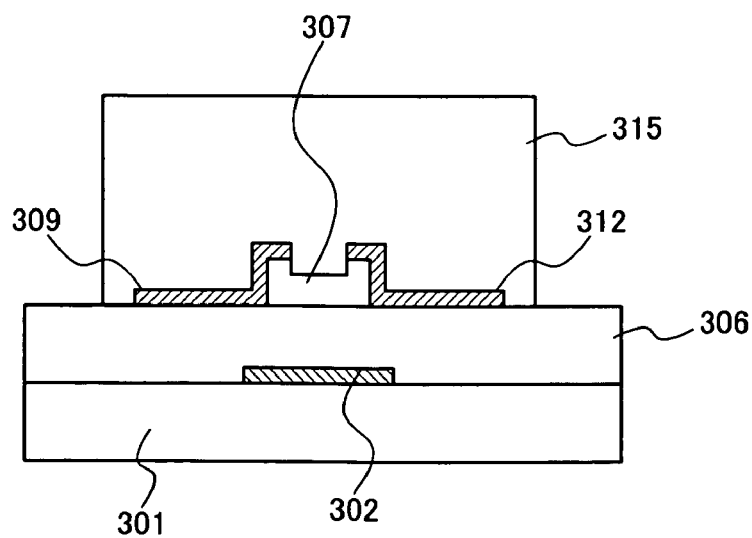

Then, as shown in FIGS. 7B and 8F, a photoresist film 315 for repair is formed. The photoresist film 315 is formed in a manner of covering at least the source electrode 309, the source line 310, the drain electrode 312, the drain line 313, the semiconductor film 307 and the protective film 308, and further covering the gate insulating film 306 in their vicinities. The photoresist film 315 has an outline shape that corresponds the outline shape of the plural conductive patterns and covers the source electrode 309, the source line 310, the drain electrode 312, the drain line 313, the semiconductor film 307 and the protective film 308. The photoresist film 315 also overlays residual patterns 317 extending across the conductive patterns.

Figure 8G:
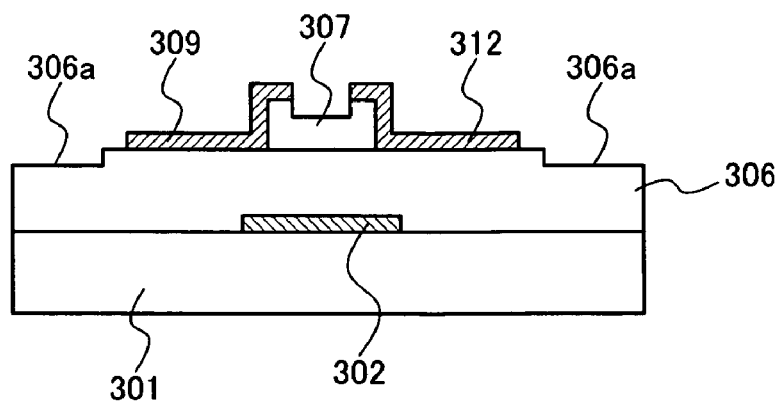

Next, wet and dry etchings are sequentially performed by using the photoresist film 315 as a mask. Due to this etching, a residual pattern existing on the gate insulating film 306 is etched. In addition, due to this etching, as shown in FIG. 8G, the gate insulating film 306 in areas where the photoresist film 315 does not cover is etched, and a recessed portion 306a is formed on the surface of the gate insulating film 306.

Figure 7C:
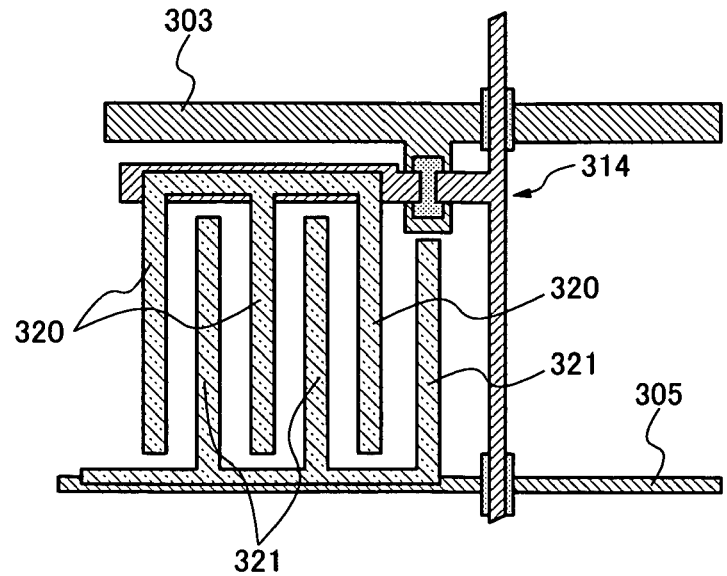
Figure 8H:
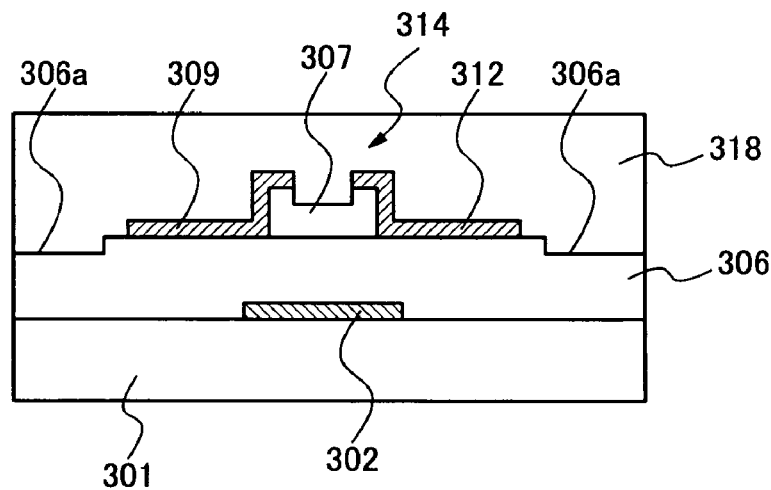
Figure 8I:
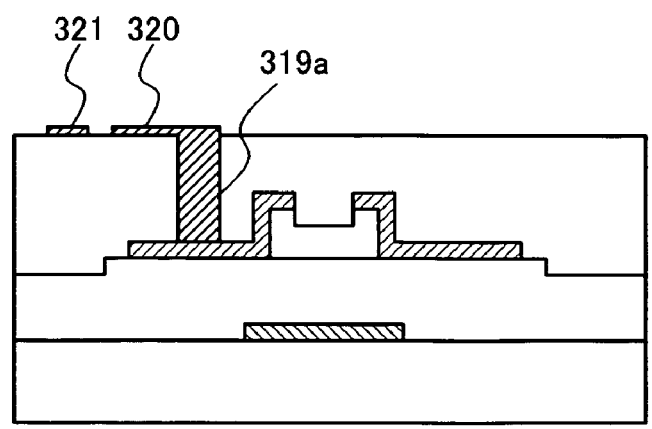

Subsequently, an interlayer insulating film 318 is formed all over as shown in FIG. 8H. In addition, a contact hole 319a extending to the source line 310 is formed in the interlayer insulating film 318 as shown in FIG. 8I. At this point, an unillustrated contact hole, which penetrates through the interlayer insulating film 318 and the gate insulating film 306, is formed. Furthermore, a transparent conductive film such as an ITO is formed on the interlayer insulating film 318. By patterning the film, as shown in FIGS. 7C and 8I, pixel electrodes 320 are formed on the interlayer insulating film 318, thus being electrically connected to the source electrode 309 via the contact hole 319a. At this point, common electrodes 321 are formed on the interlayer insulating film 318, thus being electrically connected to the common line 305 via an unillustrated contact hole. The pixel electrode 320 and the common electrode 321 are alternately arranged in parallel with each other on the interlayer insulating film 318. Voltage is applied between the pixel electrode 320 and the common electrode 321. Therefore, the liquid crystal molecules in the liquid crystal layer are rotated in a plane surface, thus performing a display control.

Next, descriptions will be given of a manufacturing method of the third exemplary embodiment in a state where a pattern defect such as a residual pattern occurs. Firstly, a conductive film is formed all over the glass substrate 301. By patterning the film, the gate electrode 302, the gate line 303 and the common line 305 are formed as shown in FIGS. 8A and 8E. As shown in FIG. 8A, the gate electrode 302 and the gate line 303 are formed in one piece, and the gate electrode 302 is formed by branching off the gate line 303. Following this, the gate insulating film 306 is formed in a manner of covering these electrodes and lines and the glass substrate 301. For example, a SiNx film with a thickness of 300 nm to 600 nm is used as the gate insulating film 306, the film being formed by the CVD method. Moreover, a non-doped a-Si semiconductor film and an n$^+$ semiconductor film doped with n-type impurities are sequentially deposited to form a multilayer structure. Thereafter, the films are patterned and the island-shaped semiconductor film 307 and protective film 308 are formed. If a foreign substance attaches before the coating or exposure, photoresist material remains in unexpected area. If patterning is performed with a photoresist pattern in which the photoresist is remaining, a residual pattern 316 of the semiconductor film is formed.

Then, a Cr film with a thickness of 100 nm to 250 nm is formed by the sputtering method in a manner of covering the gate insulating film 306, the semiconductor film 307 and the protective film 308. The film is patterned by sequentially performing wet and dry etchings. As shown in FIG. 8A, the source electrode 309, the source line 310, the drain electrode 312 and the drain line 313 are formed. At this point, the n$^+$ semiconductor film of the semiconductor film 307 exposed between the source electrode 309 and the drain electrode 312 is removed. Hence, source and drain regions are separated with a channel region interposed therebetween. Furthermore, upon removing the n$^+$ semiconductor film, a part of the surface of the non-doped a-Si semiconductor film is also removed.

If an unillustrated foreign substance attaches before the coating or exposure for patterning this Cr film, a photoresist material remains in unexpected area. If patterning is performed with a photoresist pattern in which the photoresist is remaining, a residual pattern 317 of the Cr film is formed. In FIG. 8A, the outlines of the normal source line 310 and drain line 313 and the outline of the residual pattern 317 are drawn as separate patterns to facilitate understanding. In reality, patterning is performed on one Cr film and the source line 310, the drain line 313 and the residual pattern 317 are formed. Therefore, they are formed in one piece in the same layer.

Here, detailed descriptions will be given of a pattern defect caused by an attached foreign substance. The foreign substance results from an operator, a manufacturing facility, a photoresist film or the like. Its size is assumed to be approximately 3 μm and over. If such a foreign substance attaches before the coating or exposure for patterning, a photoresist material remains in unexpected area. Hence, patterning is performed with a photoresist pattern in which the photoresist is remaining. Hence, the residual pattern 316 of the semiconductor film and the residual pattern 317 of the Cr film are formed. The residual patterns 316 and 317 are drawn slightly exaggeratedly to facilitate understanding. In FIG. 8A, a residual pattern 316 exists in a manner of extending below the source line 310 and the drain line 313. The other residual patterns 317 exist in a manner of extending across the source line 310 and the drain line 313, and they are shorted.

The photoresist film 315 for repair is then formed as shown in FIGS. 8B and 8F. This photoresist film 315 is formed in a manner of covering at least the source electrode 309, the source line 310, the drain electrode 312, the drain line 313, the semiconductor film 307 and the protective film 308, and further covering the gate insulating film 306 in their vicinities. Specifically, the photoresist film 315 extends only 0.25 µm to 1.0 µm outside from the outer edges of these electrodes and lines and the semiconductor film and is formed so as to cover the gate insulating film 306 in their vicinities. For example, the photoresist film covering each electrode and line is formed in a manner of making its width only 0.5 µm to 1.0 µm wider than that of each electrode or line.

Next, wet and dry etchings are sequentially performed by using this photoresist film 315 as a mask. This is the etching for removing the residual pattern 317 of the Cr film. In the wet etching, nitric mixed acid is used as an etchant, for example. In the dry etching, mixed gas of chlorine and oxygen is used as an etching gas, for example. The reason for performing the etchings in sequence in this manner is as explained in the first embodiment. Due to these etchings, the residual pattern 317 in areas which are not covered with the photoresist film 315 are removed as shown in FIG. 8C. For this reason, most of the residual pattern 317 existing in a manner of extending across the source line 310 and the drain line 313 are removed, thus leaving it as minute residual patterns 317a. The source line 310 and the drain line 313 are separated.

Subsequently, the dry etching is performed by using the photoresist film 315 as a mask. This is the etching for removing a residual pattern 316 of the semiconductor film. The mixed gas of $SF_6$ and He is used as an etching gas, for example. Due to this etching, most of the residual pattern 316 existing in a manner of extending below the source line 310 and the drain line 313 are removed, thus leaving it as minute residual patterns 316a. FIG. 8C shows a state after removing the photoresist film 315.

Furthermore, due to the etching with use of the photoresist film 315 as a mask, as shown in FIG. 8G, the gate insulating film 306 in areas where the photoresist film 315 does not cover is etched by approximately 25 nm, and the recessed portion 306a is formed on the surface of the gate insulating film 306. The thickness of the gate insulating film 306 is formed slightly thickly, expecting the amount of a decrease due to this etching. Due to the design and manufacture considering in this manner, it is possible to prevent the occurrence of a coloring phenomenon attributable to a decrease in film thickness, in which it is colored in red upon a panel display since the spectrum of transmittance of a backlight is shifted.

Then, as shown in FIG. 8H, the interlayer insulating film 318 is formed all over. Furthermore, as shown in FIG. 8I, the contact hole 319a is formed in the interlayer insulating film 318. Moreover, as shown in FIG. 8I, the contact hole 319a extending to the source line 310 is formed on the interlayer insulating film 318. At this point, an unillustrated contact hole penetrating through the interlayer insulating film 318 and the gate insulating film 306 is formed. Additionally, a transparent conductive film such as ITO is formed on the interlayer insulating film 318. By patterning the film, as shown in FIGS. 7C and 8I, the pixel electrodes 320 are formed on the interlayer insulating film 318, thus being electrically connected to the source electrode 309 via the contact hole 319. At this point, the common electrodes 321 are formed on the interlayer insulating film 318, thus being electrically connected to the common line 305 via an unillustrated contact hole.

Thereafter, similarly to a method of manufacturing a conventional IPS-type liquid crystal display device, an IPS-type liquid crystal display device is completed as shown in FIG. 4A. To give an explanation briefly, an orientation film 11 is formed on the surface of an active matrix film substrate 10 described above. A shielding film 13, which is a matrix or striped shape, is formed on the surface of a counter substrate 12 in areas between pixels within a display area. A color filter is arranged in each area of pixel regions surrounded by the shielding films 13. The color filter is formed of a red layer 14R, a green layer 14G and a blue layer 14B. Further, the orientation film 11 is formed on the surface of the color filters and the shielding films 13. Additionally, the active matrix substrate 10 and the counter substrate 12 are bonded in a state of holding a liquid crystal layer 15, thereby completing the liquid crystal display device of the embodiment.

According to the embodiment, the etching is performed by using the photoresist film 315 as a mask, after patterning the source electrode 309, the source line 310, the drain electrode 312 and the drain line 313. Due to this etching, most of the residual patterns 317 formed upon patterning the source electrode 309, the source line 310, the drain electrode 312 and the drain line 313, are removed, and the remaining parts become the minute residual patterns 317a. Since unnecessary residual patterns 317 are removed, a short between neighboring lines and electrodes does not occur. Therefore, it is made possible to solve a pattern defect caused by a foreign substance. In addition, due to the etching with use of the photoresist film 315 as a mask, the residual patterns 316, which is formed upon patterning the semiconductor film 307 and the protective films 308, are also etched, and most of the patterns are removed. Hence, they are made to be the minute residual patterns 316a. Since the unnecessary residual patterns 316 are removed, a possibility of a short between neighboring lines and electrodes decreases, thus making it possible to solve a pattern defect caused by a foreign substance.

Moreover, in the embodiment, since the residual patterns 317 in a plurality of areas are etched all together, it is possible to solve a pattern defect caused by a foreign substance while increasing the number of manufacturing steps as few as possible. Additionally, since the residual patterns 316 in a plurality of areas are etched all together by use of the same mask, it is possible to solve a pattern defect caused by a foreign substance while increasing the number of manufacturing steps as few as possible. Moreover, in the embodiment, since the residual patterns 316 and 317 are etched using the same photoresist film 315 as a mask, it is possible to solve a pattern defect caused by a foreign substance while increasing the number of manufacturing steps as few as possible.

As described above, the preferable embodiments are described. However, it should be noted that the present invention is not limited to the above-mentioned embodiments, and that various changes and applications to other structures are possible.

In the above-mentioned embodiments, the descriptions were given of the case where a Cr film is used as a conductive film formed on an insulating film. However, it is also possible to make it another material or a layer structure. For example, it can be considered to be a multilayer structure of an Al alloy/Mo alloy. At this point, wet etching is used with, for example, a mixed etchant of phosphoric acid, acetic acid and nitric acid for the patterning of the multilayer structure of an Al alloy/Mo alloy. Furthermore, also in the later etching of residual patterns for solving a pattern defect, the wet etching is used with a mixed etchant of phosphoric acid, acetic acid and nitric acid.

Furthermore, as an example of an insulating film, the descriptions were given of the case where a SiNx film is used as a gate insulating film. However, it is possible to make it another material or a multilayer structure. For example, it is considered to use a multilayer film of a SiNx film/a SiOx film. At this point, a thickness of the SiNx film is assumed to be, for example, 400 nm, and a thickness of the SiOx film is assumed to be, for example, 100 nm. Also in this case, the film thicknesses are designed, considering the fact that the surface of the gate insulating film is to be etched.

Furthermore, in the above-mentioned embodiments, the descriptions were given of the cases of application to a display area in an active matrix substrate. However, it is possible to apply the present invention also to a neighboring peripheral area of the display area of the active matrix substrate. In the peripheral area, there arranged an external connection terminal, a gate line taken in the above-mentioned embodiments, a lead connecting a common line to a drain line, an electrostatic protection circuit for easing a damage caused by static electricity of the gate and drain lines, a line replacement part replacing a wiring layer in areas where the gate line is required to cross the drain line, and the like. A pattern defect caused by an attached foreign substance can occur not only in the display area, but also in a peripheral area where they are arranged. Hence, it is possible to apply the present invention to a conductive pattern in such a peripheral area. Due to this application, most of residual patterns of the conductive pattern are removed, thus making the residual patterns minute. Because of this, it is possible to solve the pattern defect caused by the attached foreign substance. In addition, it is possible to solve the pattern defect caused by the attached foreign substance without increasing the number of manufacturing steps to a large extent.

Moreover, it is possible for the present invention to simultaneously etch residual patterns in the display area and residual patterns in the peripheral area by one mask, thus making it possible to solve a pattern defect caused by a foreign substance without increasing the number of manufacturing steps to a large extent. Even if there exist many residual patterns on a gate insulating film in a display or peripheral area, it is possible for the present invention to simultaneously remove them all together, thus making the residual patterns minute. Hence, pattern defects caused by foreign substances can be solved all together.

Additionally, the etching using the photoresist films 115, 215 and 315 as masks, which characterizes the present invention, is not performed according to a result obtained by carrying out an inspection to detect a pattern defect or a display defect wherever necessary, but is preferable to be unconditionally performed on all active matrix substrates manufactured. Due to this etching, it is possible to make the thickness of a gate insulating film the same between a plurality of active matrix substrates manufactured in a mass production process. Therefore, it is possible to make a shifting amount of spectrum of transmittance of a backlight the same, the shifting amount being caused by a difference in thicknesses. Accordingly, it is possible to eliminate variations in color between a plurality of active matrix substrates manufactured.

Moreover, in the above-mentioned embodiments, the descriptions were given of the manufacturing method in which the active matrix substrate is bonded to the counter substrate in a state of holding the liquid crystal layer. However, it is possible to use a method of injecting liquid crystal material in between the substrates after bonding the active matrix substrate and the counter substrate.

Although preferred embodiments of the invention has been described with reference to the drawings, it will be obvious to those skilled in the art that various changes or modifications may be made without departing from the true scope of the invention.

What is claimed is:

1. A method of manufacturing a liquid crystal display device which holds a liquid crystal layer between an active matrix substrate and a counter substrate, the method comprising the steps of:

forming an insulating film above the active matrix substrate;

forming a plurality of conductive patterns on the insulating film by patterning a conductive film formed on the insulating film;

forming a photoresist film which has an outline shape that corresponds to an outline shape of the plurality of conductive patterns and covers at least the plurality of conductive patterns, and which photoresist film additionally contacts and covers the insulating film in vicinities immediately adjacent the covered conductive patterns, and which photoresist film overlays portions of conductive residual patterns extending across the conductive patterns; and etching portions of the residual patterns which are not covered by the photoresist film, are outside the outline shape of the photoresist film, and exist above the active matrix substrate by using the photoresist film as a mask.

2. The method of manufacturing a liquid crystal display device according to claim 1, further comprising the steps of, after removing the photoresist film:

forming an interlayer insulating film which covers the insulating film and the conductive pattern;

forming a contact hole which extends to the conductive pattern in the interlayer insulating film; and forming a pixel electrode on the interlayer insulating film and electrically connecting the pixel electrode to the conductive pattern via the contact hole.

3. The method of manufacturing a liquid crystal display device according to claim 1, wherein in the etching with use of the photoresist film as a mask, a surface of the insulating film in areas where the photoresist film does not cover is etched, thus forming a recessed portion adjacent the outline of the photoresist film.

4. The method of manufacturing a liquid crystal display device according to claim 3, further comprising the steps of, after removing the photoresist film, forming an interlayer insulating film which covers the insulating film and the conductive pattern;

forming a contact hole which extends to the conductive pattern in the interlayer insulating film; and forming a pixel electrode on the interlayer insulating film and electrically connecting the pixel electrode to the conductive pattern via the contact hole.

5. The method of manufacturing a liquid crystal display device according to claim 3, wherein
said forming a plurality of conductive patterns step forms a semiconductor film with a channel region of a thin film transistor formed between a gate insulating film, and source and drain electrodes, and
said etching step comprises a first etching step in which residual patterns of the conductive pattern are removed, and a second etching step in which residual patterns of the semiconductor film are removed, are sequentially performed by using the photoresist film as a mask.

6. The method of manufacturing a liquid crystal display device according to claim 1, wherein the etching with use of the photoresist film as a mask is an etching in which wet and dry etchings are used in sequence.

7. The method of manufacturing a liquid crystal display device according to claim 6, further comprising the steps of, after removing the photoresist film:
forming an interlayer insulating film which covers the insulating film and the conductive pattern;
forming a contact hole which extends to the conductive pattern in the interlayer insulating film; and
forming a pixel electrode on the interlayer insulating film and electrically connecting the pixel electrode to the conductive pattern via the contact hole.

8. The method of manufacturing a liquid crystal display device according to claim 6, wherein, in the etching with use of the photoresist film as a mask, a surface of the insulating film in areas where the photoresist film does not cover is etched, thus forming a recessed portion adjacent the outline of the photoresist film.

9. The method of manufacturing a liquid crystal display device according to claim 8, further comprising the steps of, after removing the photoresist film:
forming an interlayer insulating film which covers the insulating film and the conductive pattern;
forming a contact hole which extends to the conductive pattern in the interlayer insulating film; and
forming a pixel electrode in the interlayer insulating film and electrically connecting the pixel electrode to the conductive pattern via the contact hole.

10. The method of manufacturing a liquid crystal display device according to claim 8, wherein
a semiconductor film, a channel region of a thin film transistor between a gate insulating film, and source and drain electrodes are formed, and
said etching step comprises a first etching, in which first residual patterns of the conductive pattern are removed, and a second etching, in which second residual patterns of the semiconductor film are removed, are sequentially performed by using the photoresist film as a mask, the first residual patterns being located at first locations at a first level and the second residual patterns being located, at second locations at a second level deeper than the first level.

11. The method of manufacturing a liquid crystal display device according to claim 1, wherein
the insulating film is a gate insulating film, and
the conductive pattern is a source electrode and a drain electrode and a drain line, which is formed on the gate insulating film.

12. The method of manufacturing a liquid crystal display device according to claim 11, wherein a semiconductor film, a channel region of a thin film transistor between the gate insulating film, and the source and drain electrodes are formed, and
said etching step comprises a first etching, in which first residual patterns of the conductive pattern are removed, and a second etching, in which second residual patterns of the semiconductor film are removed, are sequentially performed by using the photoresist film as a mask, and the first residual patterns being located at first locations at a first level and the second residual patterns being located at second locations at a second level deeper than the first location level.

13. The method of manufacturing a liquid crystal display device according to claim 11, wherein, in the etching with use of the photoresist film as a mask, a surface of the insulating film in areas where the photoresist film does not cover is etched, thus forming a recessed portion adjacent the outline of the photoresist film.

14. The method of manufacturing a liquid crystal display device according to claim 13, further comprising the steps of, after removing the photoresist film,
forming an interlayer insulating film which covers the insulating film and the conductive pattern;
forming a contact hole which extends to the conductive pattern in the interlayer insulating film; and
forming a pixel electrode on the interlayer insulating film and electrically connecting the pixel electrode to the conductive pattern via the contact hole.

15. The method of manufacturing a liquid crystal display device according to claim 13, wherein
a semiconductor film, a channel region of a thin film transistor between the gate insulating film, and the source and drain electrodes are formed, and
said etching step comprises a first etching, in which residual patterns of the conductive pattern are removed, and a second etching, in which residual patterns of the semiconductor film are removed, are sequentially performed by using the photoresist film as a mask.

16. The method of manufacturing a liquid crystal display device according to claim 11, wherein the etching with use of the photoresist film as a mask is an etching in which wet and dry etchings are used in sequence, the wet etching followed by the dry etching.

17. The method of manufacturing a liquid crystal display device according to claim 16, further comprising the steps of, after removing the photoresist film,
forming an interlayer insulating film which covers the insulating film and the conductive pattern;
forming a contact hole which extends to the conductive pattern in the interlayer insulating film; and
forming a pixel electrode on the interlayer insulating film and electrically connecting the pixel electrode to the conductive pattern via the contact hole.

18. The method of manufacturing a liquid crystal display device according to claim 16, wherein, in the etching with use of the photoresist film as a mask, a surface of the insulating film in areas where the photoresist film does not cover is etched, thus forming a recessed portion adjacent the outline of the photoresist film.

19. The method of manufacturing a liquid crystal display device according to claim 18, further comprising the steps of, after removing the photoresist film,
forming an interlayer insulating film which covers the insulating film and the conductive pattern;
forming a contact hole which extends to the conductive pattern in the interlayer insulating film; and forming a pixel electrode on the interlayer insulating film and electrically connecting the pixel electrode to the conductive pattern via the contact hole.

20. The method of manufacturing a liquid crystal display device according to claim 18, wherein
   a semiconductor film, a channel region of a thin film transistor between the gate insulating film, and the source and drain electrodes are formed, and
   said etching step comprises a first etching, in which residual patterns of the conductive pattern are removed, and a second etching, in which residual patterns of the semiconductor film are removed, are sequentially performed by using the photoresist film as a mask.

21. A method of manufacturing a liquid crystal display device which holds a liquid crystal layer between an active matrix substrate and a counter substrate, the method comprising the steps of:
   forming an insulating film in contact with the active matrix substrate;
   forming plural conductive patterns contacting the insulating film and contacting the substrate, the conductive patterns being elements of a thin film transistor;
   forming a photoresist film with a perimeter outlining an outline shape of the plural conductive patterns, the photoresist film contacting and covering at least the conductive patterns contacting the insulating film, the photoresist film additionally contacting and covering the insulating film in vicinities immediately adjacent the covered conductive patterns, and the photoresist film overlaying portions of conductive residual patterns extending across pairs of adjacent conductive patterns; and
   etching portions of the insulating film and portions of the residual patterns not covered by the photoresist film that are outside the outline shape of the photoresist film and exist above the active matrix substrate by using the photoresist film as a mask, wherein,
   said etching step results in the insulating film in the vicinities immediately adjacent the covered conductive patterns having a greater thickness than the portions of the insulating film not covered by the photoresist film, and
   said etching step removes first residual patterns and second residual patterns, the first residual patterns being located at first locations at a first level and the second residual patterns being located at second locations at a second level deeper than the first level.

* * * * *